United States Patent
Connell et al.

(10) Patent No.: US 6,920,316 B2
(45) Date of Patent: Jul. 19, 2005

(54) HIGH PERFORMANCE INTEGRATED CIRCUIT REGULATOR WITH SUBSTRATE TRANSIENT SUPPRESSION

(75) Inventors: Lawrence Edwin Connell, Naperville, IL (US); Neal W. Hollenbeck, Palatine, IL (US); Michael Lee Bushman, Hanover Park, IL (US); Daniel Patrick McCarthy, Elk Grove Village, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 596 days.

(21) Appl. No.: 09/946,010

(22) Filed: Sep. 4, 2001

(65) Prior Publication Data

US 2003/0050026 A1 Mar. 13, 2003

(51) Int. Cl.⁷ .............................. H04B 1/26; H04B 1/18
(52) U.S. Cl. ................. 455/183.1; 455/180.1; 455/182.1; 455/195.1; 455/196.1
(58) Field of Search ................ 455/180.1, 182.1, 455/183.1, 195.1, 196.1; 331/17, 25, 117; 348/731, 732; 363/21, 98; 323/282, 284; 379/84

(56) References Cited

U.S. PATENT DOCUMENTS

| | | | |
|---|---|---|---|
| 4,112,377 A | * 9/1978 | Tanner et al. | 455/131 |
| 4,477,919 A | * 10/1984 | Borras et al. | 377/47 |
| 5,563,501 A | 10/1996 | Chan | |
| 5,613,229 A | 3/1997 | Baranowski et al. | |
| 5,712,555 A | * 1/1998 | Jackson et al. | 323/273 |
| 5,822,200 A | * 10/1998 | Stasz | 363/21.18 |
| 6,271,651 B1 | 8/2001 | Stratakos et al. | |
| 6,304,066 B1 | * 10/2001 | Wilcox et al. | 323/282 |
| 6,486,795 B1 | * 11/2002 | Sobel et al. | 340/825.72 |
| 2002/0118308 A1 | * 8/2002 | Dujmenovic | |
| 2002/0135428 A1 | * 9/2002 | Gomez | |

* cited by examiner

Primary Examiner—Allan Hoosain

(57) ABSTRACT

A regulation circuit, incorporated in a single integrated circuit with a first circuit load, which as an input coupled to a power supply which produces a source voltage, and a first output coupled to the first circuit load. The regulation circuit comprises an input capacitor for reducing the magnitude of a voltage change at the first output, and at least a first voltage regulator for producing a predetermined voltage at the first load.

36 Claims, 3 Drawing Sheets

HIGH PERFORMANCE INTEGRATED CIRCUIT REGULATOR WITH SUBSTRATE TRANSIENT SUPPRESSION

BACKGROUND

The present invention relates generally to regulation circuits. More specifically, the present invention relates to a high performance regulation circuit load are that is fully integrated onto a single CMOS integrated circuit with a circuit load.

The demand for smaller and faster electronic devices has increased the demand for integrated circuitry. This results in a greater use of digital components in the integrated circuit's load. Unfortunately, the use of digital circuitry may produce circuit noise that can affect the performance of the integrated circuit. Examples of such circuits are mixed-mode circuits, analog circuitry along with digital circuits, and large digital circuits that generate a lot of noise. In order to reduce this concern with integrated circuitry, regulation circuits have been used.

An example of an integrated mixed-mode circuit that requires regulation is a broadband tuner. Broadband tuners are integrated into a wide range of consumer electronics, ranging from familiar household standards, such as televisions and VCRs to newer more complex devices including cable settop boxes, cable modems, cable telephony systems, web TVs, PC/TV and the various implementations of digital television. Functioning as the RF broadband gateway, the basic function of a tuner in these devices is to receive all available channels in the input bandwidth, select a desired channel and reject all others and translate the desired channel to a standard intermediate frequency (IF). These tuners operate over a frequency range of 50–860 MHz, taking into consideration those frequencies used by broadcast television and cable operators.

Tuners that enable products to support PC, TV and internet functionality have very different performance requirements than the traditional television tuner. As applications become more sophisticated, tuners with higher performance are required. Tuners are increasingly being required to be fully integrated into a single integrated circuit. However, the performance of existing integrated tuners is limited by the phase noise of a fully integrated oscillator within the broadband tuner. To improve the performance of the tuner, a lower phase noise fully integrated oscillator is used.

Also used to improve the performance of the single integrated circuit tuner is a low noise amplifier combined with a voltage controlled oscillator (VCO) and frequency synthesizer onto the common integrated circuit substrate. In order to implement this combination, systems have employed current steering logic for the synthesizer frequency dividers. This is done to minimize the frequency disturbance (spurs) generated by the dividers and prevent them from interfering with the low noise amplifier when the low noise amplifier, frequency dividers, and other sensitive analog circuitry are integrated onto a common substrate. Unfortunately, current steering frequency dividers have high phase noise and severely limit the phase noise performance achievable for an integrated VCO.

Accordingly, there is a need for a regulation circuit that can be combined with a circuit load on a single integrated circuit substrate, which prevents substrate disturbances generated by the circuit load from interfering with the output.

There is also a need for a fully integrated tuner which combines low noise broadband radio frequency amplifiers with very low phase noise digital frequency synthesizer dividers on a single integrated circuit substrate and which prevents the frequency disturbances generated by these digital dividers from interfering with the broadband low noise amplifier.

SUMMARY

A regulation circuit, incorporated in a single integrated circuit with a first circuit load, which as an input coupled to a power supply which produces a source voltage, and a first output coupled to the first circuit load. The regulation circuit comprises an input capacitor for reducing the magnitude of a voltage change at the first output, and at least a first voltage regulator for producing a predetermined voltage at the first load.

BRIEF DESCRIPTION OF THE DRAWING(S)

The present invention will hereinafter be described in conjunction with the appended drawing figures, wherein like numerals denote like elements, and:

DETAILED DESCRIPTION OF THE PREFERRED EMBODIMENT(S)

The ensuing detailed description provides preferred exemplary embodiments only, and is not intended to limit the scope, applicability, or configuration of the invention. Rather, the ensuing detailed description of the preferred exemplary embodiments will provide those skilled in the art an enabling description for implementing a preferred exemplary embodiment of the invention. It being understood that various changes may be made in the function and arrangement of elements without departing from the spirit and scope of the invention as set forth in the appended claims.

Figure 1:
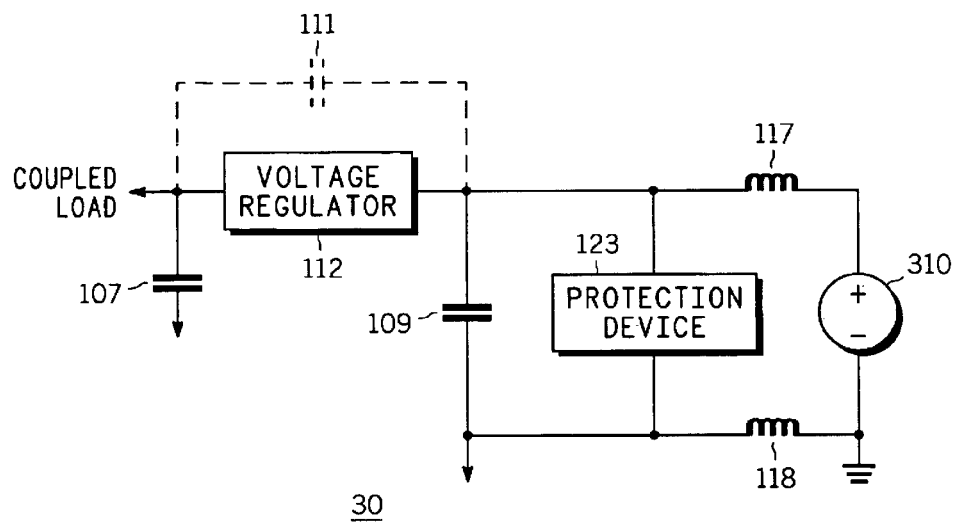
FIG. 1 is a circuit diagram of a regulation circuit in accordance with the preferred embodiment of the present invention.

Illustrated in FIG. 1 is a circuit diagram of the regulation circuit 30 in accordance with the preferred embodiment of the present invention. The regulation circuit 30 is used to generate the supply voltage to a coupled load (not shown), and attenuates any substrate disturbances. The regulation circuit 30 comprises a regulator output capacitor 107, a regulator input capacitor 109, voltage regulator 112, an electrostatic discharge protector 123 and a power supply 310. A voltage regulator circuit 112 provides the necessary voltage required to power the coupled load (not shown).

Figure 4:
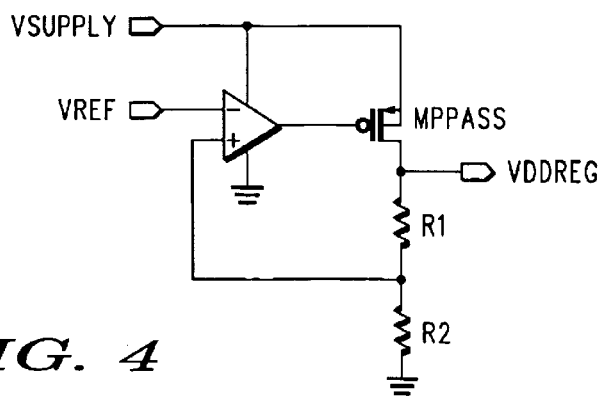
FIG. 4 is an example of a voltage regulator employed in the present invention.

An example of a voltage regulator, such as a Motorola MC78000 series, in FIG. 4. The voltage regulator 112 regulates its output to generate a predetermined output voltage which supplies any components coupled thereto. Since voltage regulators are well known in the art, a detailed discussion is not necessary and not included in this disclosure.

Referring back to FIG. 1, the regulator output capacitor 107 is coupled to the output of the voltage regulator 112. This output capacitor 107 acts as a regulator output bypass capacitor to instantly provide the current required by the load.

Coupled to the input of the voltage regulator 112 is a regulator input capacitor 109. The input capacitor 109 is placed at the input of the voltage regulator 112 input to significantly reduce the magnitude of any substrate disturbance. Without this regulator input capacitor 109, whenever a digital switching event occurs within any digital switching devices included within the coupled load (not shown), a correspondingly fast voltage change across the regulator output capacitor 107 is produced. This voltage change would be instantly transferred to the regulator input inductance 117, 118, the bond wire to the power supply 310, and through the parasitic capacitance 111 seen across a regulator pass device $MP_{pass}$ of the voltage regulator 112, to cause a disturbance to the integrated circuit substrate voltage level commensurate with the regulator 112 output voltage change. The input capacitor 109 works in conjunction with the parasitic capacitance 111 of the regulator pass device $MP_{pass}$ shown in FIG. 4 to capacitively divide any regulator 112 output voltage change before it is transferred to the input supply inductance 117, 118. Due to the input capacitor 109, the associated substrate disturbance is similarly attenuated.

As an example, consider a voltage regulator 112 which contains a pass device $MP_{pass}$ that has a parasitic capacitance 111 across its input and output terminals of about 1 pf. The regulator 112 is used to supply power to a circuit load. If a 1000 pf capacitor 107 is placed only at the regulator's 112 output and no capacitance is placed at its input, a digital switching event occurring within the load can produce near instantaneous 40 mV drop in voltage across regulator output capacitor 107. Without a regulator input capacitor 109, this 40 mV voltage change would be instantaneously transferred to the regulator input inductance 117 and through the parasitic capacitance 111 seen across the regulator pass device $MP_{pass}$, causing about a 40 mV disturbance to the integrated circuit substrate. In this example, the input inductance 117 has a value of 2.5 nH.

Alternatively, if a 1000 pf capacitor 109 is placed across the regulator 112 input supply terminals, in accordance with the present invention, a capacitive attenuation of 1000 will be realized and the substrate disturbance will be reduced by a factor of 1000, (the ratio of input capacitor 109 to the parasitic capacitance 111). To produce a similar result with only a regulator output capacitor 107 would require an output capacitance value of 1,000,000 pf. Therefore, this integrated regulator input capacitor 109 effectively multiplies the already large regulator output capacitor 107 by a factor of 1000 (ratio of C109/C111), as compared to the example without the input capacitor 107. When this regulator circuit 30 having the integrated regulator input capacitor 109 is used to supply power to a high performance digital circuit which produces 100 mA switching currents at a 25 MHz rate, all switching spurs are attenuated to less than 1.0 mVrms.

Figure 2:
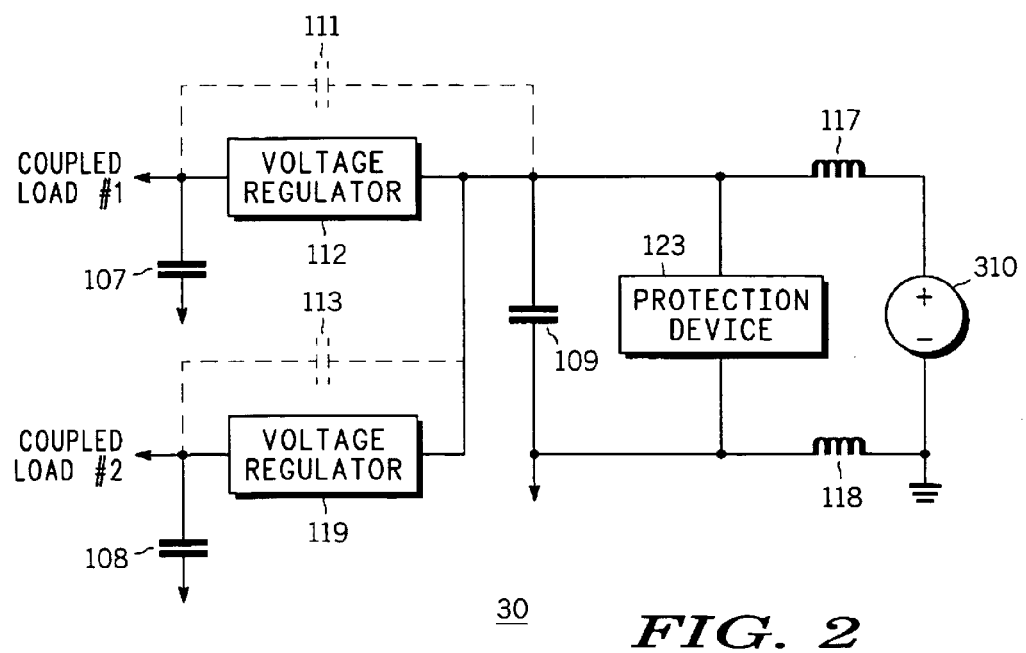
FIG. 2 is a circuit diagram of an alternative regulation circuit of the present invention.
Figure 3:
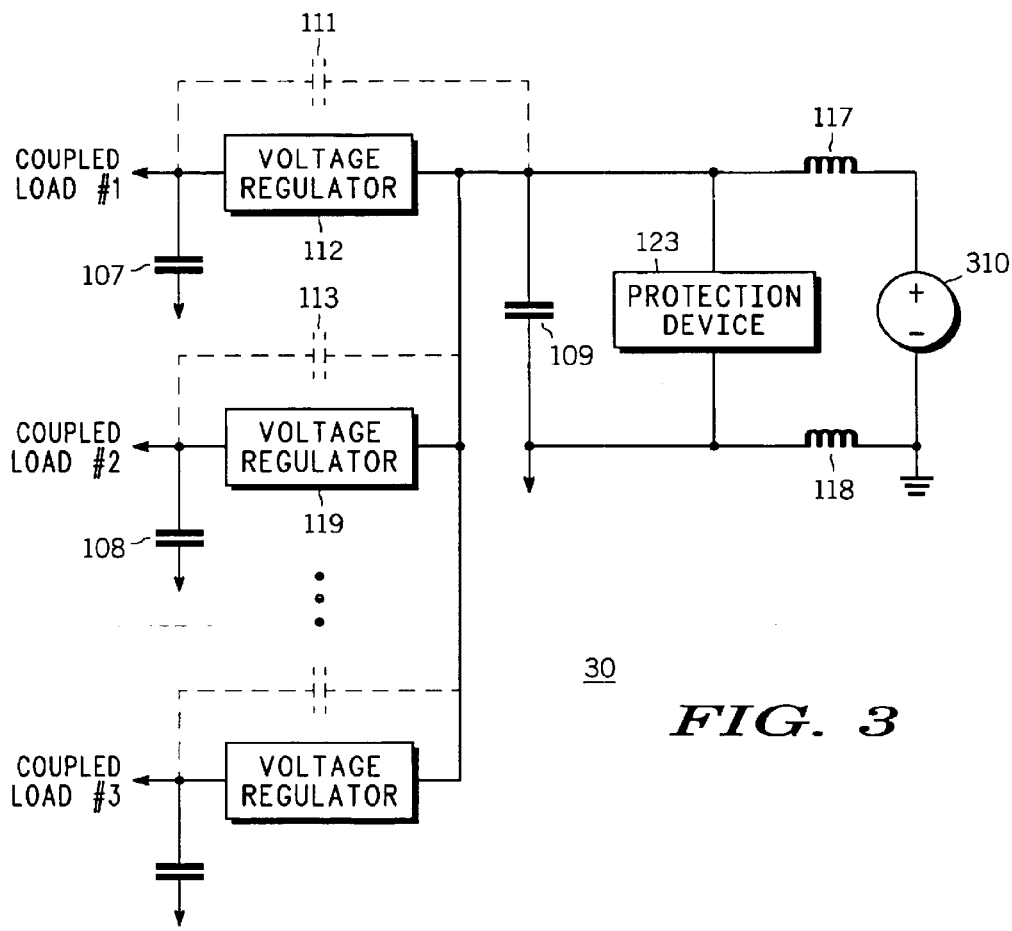
FIG. 3 is a circuit diagram of a second alternative regulation circuit of the present invention.

Although a single voltage regulator has been illustrated as serving a single coupled load, the output may be coupled to several loads. Furthermore, two separate voltage regulators, as shown in FIG. 2, may be used to provide the necessary voltage to multiple component loads, as well as attenuate any substrate disturbances caused by the switching events of the components. It should also be apparent to those having skill in the art that the coupling of the loads to the voltage regulators may be configured in any number of ways, and that more than two voltage regulators can be used in the regulation circuit 30, as shown in FIG. 3.

In the preferred embodiment of the present invention, in order to minimize the integrated circuit area and cost, a thin oxide transistor is used to implement input capacitor 109. In order to prevent this capacitor 109 from being damaged during an electrostatic discharge event, an electrostatic discharge protector 123 is also integrated on chip and placed directly across from input capacitor 109.

As disclosed above, the regulation circuit 30 of the present invention may be utilized to attenuate any substrate disturbances caused by a load coupled thereto. A broadband tuner An incorporating the regulator circuit of the present invention will now be disclosed in further detail.

Figure 5:
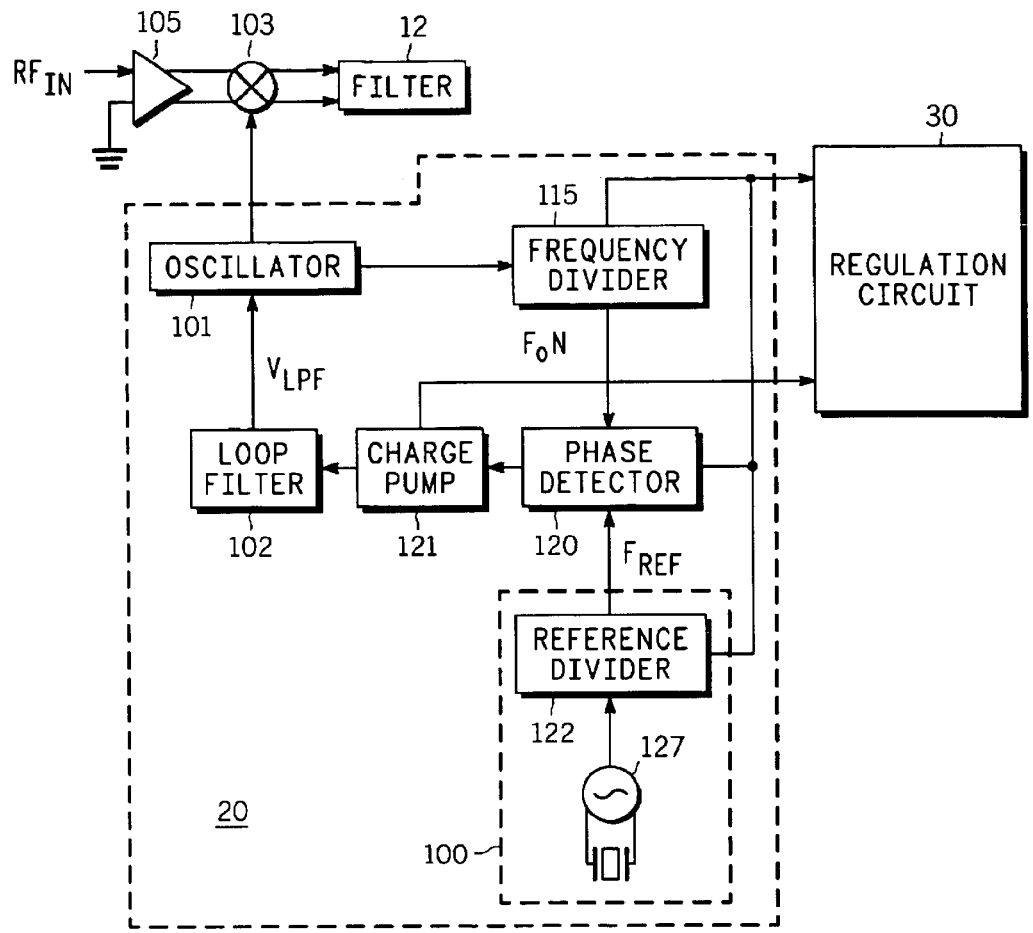
FIG. 5 is a block diagram of a broadband tuner including a regulation circuit in accordance with the preferred embodiment of the present invention.

FIG. 5 is a block diagram of a tuner system 10, made in accordance with the preferred embodiment of the present invention. The tuner system 10 comprises an amplifier 105, a mixer 103, a frequency synthesizer 20, and the regulation circuit 30. An input radio frequency (RF) signal $RF_{in}$ is received by the amplifier 105. The amplifier 105, coupled to a mixer 103, regulates the varying signal levels across the spectrum of received channels. For purposes of this disclosure, amplifier 105 is preferably a low noise amplifier which has an input frequency range of 50–860 MHz. This type of amplifier provides the least amount of noise to the tuner system 10. Although a low noise amplifier is preferable, it should be noted that other types of amplifiers may also be used (e.g. low noise amplifiers, buffers, impedance matching amplifiers, attenuators, or a mixer). The output of the amplifier 105 is forwarded to the mixer 103.

Mixer 103 is coupled to the frequency synthesizer 20, the amplifier 105, and filter 12. The mixer 103 converts RF power at one frequency into power at another frequency to make signal processing easier and also less expensive. Mixer 103 receives the amplified input signal from the amplifier 105 and a local oscillator frequency signal from frequency synthesizer 20. An intermediate frequency IF signal is generated in mixer 103 by the multiplication of the amplified input signal and the local oscillator frequency signal and provided to a filter 12. The filter 12 may then select a narrow band of channels or even a single channel from the received signal $RF_{in}$ in the IF signal.

The frequency synthesizer 20 is coupled to the mixer 103 and a regulation circuit 30. The frequency synthesizer 20 comprises a frequency divider 115, a phase detector 120, a reference generator 100, a charge pump 121, a loop filter 102, and a voltage controlled oscillator (VCO) 101. As shown in FIG. 5, the frequency synthesizer 20 is implemented in a phase locked loop (PLL) arrangement.

The VCO 101 is used to drive the mixer 103 and frequency translate the amplifier 105 input signal $RF_{in}$ to the predetermined IF signal. For exemplary purposes of this disclosure, the output frequency of the tuner 10 is about 1100 MHz, although another frequency may be used depending upon the requirements of the particular application. In order for the tuner 10 to generate such an output frequency, the VCO 101 must cover a frequency range from 1150–1960 Hz, therefore a wideband fully integrated VCO is used.

In order to cover such a large frequency span, it is known by those skilled in the art that the VCO 101 is typically implemented as either an integrated multiple resonator based design or a single digital ring oscillator design (not shown). These two configurations though, are limited due to the limited quality factor for inductors that is achievable on-chip. In order to substantially reduce the phase noise of the VCO 101 and significantly improve the performance of the tuner system 10, the VCO 101 is placed in the wideband low noise frequency synthesizer 20 where the VCO 101 noise is significantly attenuated within the bandwidth of the synthesizer 20.

The reference oscillator frequency signal of the frequency synthesizer 20 is generated by a reference generator 100. The frequency synthesizer 20 locks to this reference frequency as a result of the PLL arrangement. The reference generator 100, coupled to the phase detector 120 and the regulation circuit 30, comprises a crystal controlled oscillator 127 followed by a reference divider 122, for generating the reference frequency $F_{ref}$. As those skilled in the art know, any oscillator may be used to generate the reference frequency. However, a crystal oscillator is preferably used because of its frequency accuracy and noise performance. Also, the reference divider 122 may be eliminated as long as the reference oscillator 127 can produce the required reference frequency $F_{ref}$.

The reference frequency signal $F_{ref}$ from the reference generator 100 is forwarded to the phase detector 120. The phase detector 120, coupled to the reference generator 100, the frequency divider 115, the charge pump 121, and the regulation circuit 30, generates a signal proportional to the difference in phase between a frequency division signal Fo/N, transmitted by the frequency divider 115, and the reference frequency $F_{ref}$ forwarded by the reference generator 100. If the phase detector 120 detects a difference between the two frequency signals $F_{ref}$, Fo/N, a phase error signal is produced and forwarded to the charge pump 121.

The charge pump 121, coupled to the regulation circuit 30, the loop filter 102 and the phase detector 120, outputs a current that charges and discharges the loop filter 102 to a voltage level $V_{LPF}$. It is well known to those skilled in the art that the charging and discharging of the loop filter 102 creates a voltage change $V_{LPF}$ across the loop filter 102. This voltage change $V_{LPF}$ is a reference for the VCO 101.

The loop filter 102 is coupled to the VCO 101, as well as the charge pump 121. The loop filter 102 receives the current output generated by the charge pump 121. As a result of the charging or discharging of the loop filter 102, the voltage $V_{LPF}$ is created and output to the VCO 101.

As disclosed above, the VCO 101 generates an output frequency which drives the mixer 103 to generate the predetermined IF frequency output from the tuner 10. The VCO 101 output frequency is also forwarded to the frequency divider 115. The frequency divider 115, coupled to the VCO 101, the phase detector 120 and the regulation circuit 30, divides by N the frequency generated by the VCO 101 and used by the tuner 10 to allow the PLL configuration to lock to a frequency N times larger than the input frequency from the reference generator 100. A high performance frequency divider is used to produce a very low noise synthesizer.

Figure 6:
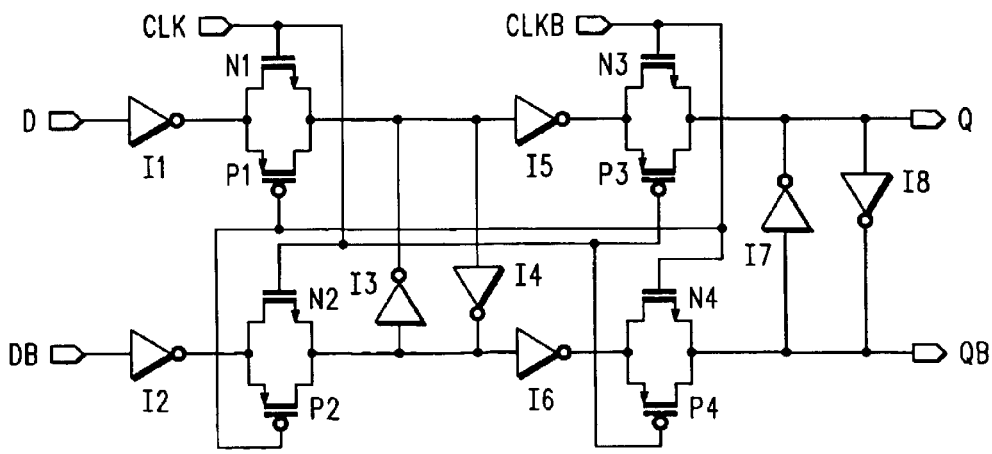
FIG. 6 is a circuit diagram of a digital D-Flop circuit used in a frequency divider of the present invention.

Referring to FIG. 6, a digital D-flop circuit configuration, used in a portion of the frequency divider 115, is shown. Although not shown in FIG. 6, the inverter sizes of the P-channel and N-channel devices of I1, I2, I5 and I6 are 40/0.35 and 20/0.35, respectively. The inverter sizes of the P-channel and N-channel devices of I3, I4, I7 and I8 are 20/0.35 and 10/0.35, respectively. Those skilled in the art would appreciate that the illustrated circuit is duplicated a plurality of times, in connection with one another, to make up the entire frequency divider. The D-flop circuit is duplicated three times to produce the frequency divider 115 in accordance with the preferred embodiment of the present invention, although more or less D-flop circuits may be used as desired. A digital frequency divider configuration is preferable because it provides low phase noise for detecting the phase difference between the frequencies $F_{ref}$, $F_O/N$, measured by the phase detector 120. The digital frequency divider output signal has approximately a 20 dB signal-to-noise advantage over a divider using current steering logic in an analog configuration.

As disclosed above, the frequency divider 115, the reference generator 100, the phase detector 120, and the charge pump 121 are coupled to the regulation circuit 30. Since each of the aforementioned components of the frequency synthesizer 115, 100, 120, 121 are digital circuits, the switching of the transistors in the circuits causes frequency disturbances on the substrate, which interfere with the amplifier 105 and other sensitive circuitry on the same substrate and adversely affects the overall performance of the tuner 10. As those skilled in the art would understand, the disturbance generated by this switching is seen on the output of the frequency synthesizer 20 and ultimately affects the output of the tuner 10. In order to prevent these frequency disturbances from interfering with the amplifier 105 located on the same integrated circuit substrate, the regulation circuit 30 is utilized. Utilizing the regulator circuit 30 illustrated in FIG. 1B for example, the frequency divider 115, the phase detector 120 and the reference generator 100 are coupled to the voltage regulator 112 as a combined "coupled load #1", whereas, the charge pump 121 is coupled to the voltage regulator 119 as "coupled load #2". When this regulator circuit 30 having the integrated regulator input capacitor 109 is used to supply power to the high performance digital frequency divider 115, which produces 100 mA switching currents at a 25 MHz rate, all switching spurs are attenuated to less than 1.0 uVrms.

The charge pump 121 is preferably powered by the second voltage regulator 119 instead of voltage regulator 112 in order to additionally prevent the frequency divider 115 and the charge pump 121 from interfering with one another. However, for any configuration, only a single regulator input capacitor 109 is required. By sharing the regulator input capacitor 109 between the two voltage regulators 112, 119, the total substrate disturbance level created by both the digital frequency divider 115 and charge pump 121 is minimized for a given total amount of regulator input capacitance 109.

To illustrate the ability of the regulation circuit 30 to attenuate the substrate disturbance associated with digital switching events of the tuner 10, refer to Table 1 below. Table 1 shows the frequency of the input signal $RF_{IN}$ and the corresponding input referred spur level for digital switching events at 12.5 MHz. As would be appreciated by those of skill in the art, for analog systems, it is desirable to have all spurious products at least −57 dBmV. For digital systems, although there is less agreement on a specific level, −50 dbc is generally referred to as a desirable target level. As shown in Table 1, the value of the spur products, using the teachings of the present invention, are well below the desired level.

TABLE 1

| $RF_{IN}$ (MHz) | Input Referred Spur Level (dbmV) |
|---|---|
| 62.5 | −70.3 |
| 87.5 | −76.3 |
| 112.5 | −69.3 |
| 137.5 | −68.3 |
| 162.5 | −66.5 |
| 187.5 | −68.5 |

What is claimed is:

1. A regulation circuit having an input coupled to a power supply, said power supply for producing a source voltage, and a first output coupled to a first circuit load, said regulation circuit comprising:
   an input capacitor, coupled to said input and ground, for reducing the magnitude of a voltage change at said first output; and
   at least a first voltage regulator, coupled to said input capacitor, for producing a predetermined voltage at said first load;
   whereby said regulation circuit and said first circuit load are incorporated in a single integrated circuit;
   wherein said input capacitor is a thin oxide N-channel transistor.

2. The regulation circuit of claim 1 further comprising a first output capacitor coupled to said first output and ground.

3. The regulation circuit of claim 2 further comprising:
   a second voltage regulator for producing a second predetermined voltage at a second load incorporated in said integrated circuit, wherein said second voltage regulator input is coupled to said input capacitor; and
   a second output capacitor, coupled to a second output and ground, said second output being an output of said second voltage regulator.

4. The regulation circuit of claim 3 wherein said first load is a single switching circuit or multiple switching circuits.

5. The regulation circuit of claim 4 wherein said second load is a single switching circuit or multiple switching circuits.

6. The regulation circuit of claim 1 further comprising a protection device for protecting said input capacitor from damage during an electrostatic discharge event.

7. A regulation circuit having an input coupled to a power supply, said power supply for producing a source voltage, and a first output coupled to a first circuit load, said regulation circuit comprising:
   an input capacitor, coupled to said input and ground, for reducing the magnitude of a voltage change at said first output; and
   at least a first voltage regulator, coupled to said input capacitor, for producing a predetermined voltage at said first load;
   whereby said regulation circuit and said first circuit load are incorporated in a single integrated circuit;
   a protection device for protecting said input capacitor from damage during an electrostatic discharge event.

8. The regulation circuit of claim 7, wherein said first load is a single switching circuit or multiple switching circuits.

9. The regulation circuit of claim 7 wherein said input capacitor is a thin oxide N-channel transistor.

10. A broadband tuner integrated on a single substrate, comprising:
    an amplifier for receiving and amplifying a broadband radio frequency (RF) input signal;
    a frequency synthesizer for generating a local oscillator frequency signal used for channel selection and frequency conversion, comprising a frequency divider for dividing the local oscillator frequency to output a divided frequency; and
    a regulation circuit having an input coupled to a power supply, said power supply for producing a source voltage, and a first output coupled to said frequency synthesizer, said regulation circuit comprising:
        an input capacitor, coupled to said input and ground, for reducing the magnitude of a voltage change at said first output; and
        at least a first voltage regulator, coupled to said input capacitor, for producing a predetermined voltage at said first load;
    wherein said regulation circuit further comprises a protection device for protecting said input capacitor from damage during an electrostatic discharge event.

11. The tuner of claim 10 further comprising a mixer for frequency translating said input signal to a predetermined intermediate frequency using said local oscillator frequency.

12. The tuner of claim 11 wherein said frequency synthesizer is implemented in a phase locked loop arrangement and further comprises:
    a reference generator for generating a reference frequency signal;
    a phase detector for measuring a phase difference between said divided frequency and said reference frequency and generating and error signal proportional to said phase difference;
    a charge pump, responsive to said error signal, for generating a charge current;
    a loop filter, responsive to said charge pump, for generating a reference voltage, wherein said reference voltage increases as said charge current decreases; and
    a voltage controlled oscillator for generating said local oscillator frequency in response to said reference voltage.

13. The tuner of claim 12 wherein said amplifier is a low noise amplifier.

14. The tuner of claim 13 wherein said frequency divider, phase detector, reference generator, and charge pump are digital circuits.

15. The tuner of claim 14 wherein said frequency divider is implemented using a digital D-Flop configuration.

16. The tuner of claim 15 wherein said regulation circuit further comprises a first output capacitor coupled to said first output and ground.

17. The tuner of claim 16 wherein said first output is further coupled to said frequency divider, phase detector, and reference generator.

18. The tuner of claim 17 wherein said second output is coupled to said charge pump.

19. The tuner of claim 16 wherein said regulation circuit further comprises:
    a second voltage regulator for producing a second predetermined voltage at a second output, wherein said second voltage regulator input is coupled to said input capacitor; and
    a second output capacitor, coupled to a second output and ground, said second output being an output of said second voltage regulator.

20. The tuner of claim 10 wherein said input capacitor is a thin oxide N-channel transistor.

21. The tuner of claim 10 wherein said regulation circuit further comprises:
    a plurality of voltage regulators for producing a second predetermined voltage at a second output, wherein said plurality of voltage regulators inputs are coupled to said input;
    a plurality of output capacitors coupled to an output of each of said plurality of voltage regulators and ground, each output being coupled to said charge pump, frequency divider, phase detector, or reference generator.

22. A broadband tuner integrated on a single substrate, comprising:
    an amplifier for receiving and amplifying a broadband radio frequency (RF) input signal;

a frequency synthesizer for generating a local oscillator frequency signal used for channel selection and frequency conversion, comprising a frequency divider for dividing the local oscillator frequency to output a divided frequency; and a regulation circuit having an input coupled to a power supply, said power supply for producing a source voltage, and a first output coupled to said frequency synthesizer, said regulation circuit comprising;

an input capacitor, coupled to said input and ground, for reducing the magnitude of a voltage change at said first output; and at least a first voltage regulator, coupled to said input capacitor, for producing a predetermined voltage at a first load;

wherein said input capacitor is a thin oxide N-channel transistor.

23. The tuner of claim 22 wherein said regulation circuit further comprises a protection device for protecting said input capacitor from damage during an electrostatic discharge event.

24. The tuner of claim 23 wherein said first output is further coupled to said frequency divider, phase detector, reference generator, and charge pump.

25. The tuner of claim 24 wherein said reference generator comprises:

a crystal oscillator for generating a signal at a low frequency; and a reference divider for receiving said signal from said crystal oscillator and multiplying said signal to produce said reference frequency.

26. A regulation circuit in a broadband tuner, wherein the tuner is integrated on a single substrate, said tuner further including an amplifier for receiving and amplifying a broadband radio frequency (RF) input signal; and a frequency synthesizer for generating a local oscillator frequency signal used for channel selection and frequency conversion, comprising a frequency divider for varying the local oscillator frequency to output a divided frequency, said regulation circuit having an input coupled to a power supply, said power supply for producing a source voltage, and an output coupled to said frequency synthesizer, said regulation circuit comprising:

an input capacitor, coupled to said input and ground, for reducing the magnitude of a voltage change at said output; and a voltage regulator, coupled to said input capacitor, for producing a predetermined voltage at said output;

a protection device for protecting said input capacitor from damage during an electrostatic discharge event.

27. The regulation circuit of claim 26 wherein said tuner further comprises a mixer for frequency translating said input signal to a predetermined intermediate frequency using said local oscillator frequency.

28. The regulation circuit of claim 27 wherein said frequency synthesizer is implemented in a phase locked loop arrangement and further comprises:

a reference generator for generating a reference frequency signal;

a phase detector for measuring the phase difference between said divided frequency and said reference frequency and generating and error signal proportional to said phase difference;

a charge pump, responsive to said error signal, for generating a charge current;

a loop filter, responsive to said charge pump, for generating a reference voltage, wherein said reference voltage increases as said charge current decreases; and a voltage controlled oscillator for generating said local oscillator frequency in response to said reference voltage.

29. The regulation circuit of claim 28 wherein said amplifier is a low noise amplifier.

30. The regulation circuit of claim 29 wherein said frequency divider, phase detector, reference generator, and charge pump are digital circuits.

31. The regulation circuit of claim 30 wherein said frequency divider is implemented using a digital D-Flop configuration.

32. The regulation circuit of claim 31 wherein said reference generator comprises:

a crystal oscillator for generating a signal at a low frequency; and a reference divider for receiving said signal from said crystal oscillator and multiplying said signal to produce said reference frequency.

33. The regulation circuit of claim 32 further comprising an output capacitor coupled to said output and ground.

34. A regulation circuit in a broadband tuner, wherein the tuner is integrated on a single substrate, said tuner further including an amplifier for receiving and amplifying a broadband radio frequency (RF) input signal; and a frequency synthesizer for generating a local oscillator frequency signal used for channel selection and frequency conversion, comprising a frequency divider for varying the local oscillator frequency to output a divided frequency, said regulation circuit having an input coupled to a power supply, said power supply for producing a source voltage, and an output coupled to said frequency synthesizer, said regulation circuit comprising;

an input capacitor, coupled to said input and ground, for reducing the magnitude of a voltage change at said output; and a voltage regulator, coupled to said input capacitor, for producing a predetermined voltage at said output;

wherein said input capacitor is a thin oxide N-channel transistor.

35. The regulation circuit of claim 34 further comprising a protection device for protecting said input capacitor from damage during an electrostatic discharge event.

36. The regulation circuit of claim 35 wherein said voltage regulator output is further coupled to said frequency divider, charge pump, phase detector and said reference generator.

* * * * *